(12) United States Patent
Adachi

(10) Patent No.: US 10,836,538 B2
(45) Date of Patent: *Nov. 17, 2020

(54) DISPLAY DEVICE

(71) Applicant: Japan Display Inc., Minato-ku (JP)

(72) Inventor: Masaya Adachi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 82 days.

This patent is subject to a terminal disclaimer.

(21) Appl. No.: 16/121,935

(22) Filed: Sep. 5, 2018

(65) Prior Publication Data

US 2019/0023455 A1 Jan. 24, 2019

Related U.S. Application Data

(63) Continuation of application No. 15/473,856, filed on Mar. 30, 2017, now Pat. No. 10,090,362.

(30) Foreign Application Priority Data

Jul. 7, 2016 (JP) .................................. 2016-135143

(51) Int. Cl.
*B65D 33/16* (2006.01)
*H01L 27/32* (2006.01)
(Continued)

(52) U.S. Cl.
CPC .......... *B65D 33/1691* (2013.01); *B31B 50/02* (2017.08); *B31B 70/142* (2017.08); *B31B 70/146* (2017.08); *B31B 70/16* (2017.08); *B31B 70/813* (2017.08); *B31D 1/021* (2013.01); *B31D 1/026* (2013.01); *B65D 33/34* (2013.01);
(Continued)

(58) Field of Classification Search
CPC ... B65D 33/1691; B65D 77/32; H01L 27/326; H01L 27/3218
See application file for complete search history.

(56) References Cited

U.S. PATENT DOCUMENTS 10,090,362 B2 * 10/2018 Adachi ................. H01L 27/124
2007/0291054 A1 12/2007 Shin et al.
(Continued)

FOREIGN PATENT DOCUMENTS

JP 2012-238544 12/2012
JP 2014-85384 5/2014

*Primary Examiner* — Anthony Ho
(74) *Attorney, Agent, or Firm* — Oblon, McClelland, Maier & Neustadt, L.L.P.

(57) ABSTRACT

A display device includes a plurality of pixels each having a plurality of light-emitting regions including at least a first light-emitting region of a first color, a second light-emitting region of a second color, and a third light-emitting region of a third color and a light-transmitting region. Visibility of the first color is higher than visibility of the second color. The plurality of light-emitting regions are divided into a first group including the first light-emitting region and a second group including the second light-emitting region. The first light-emitting region is adjacent to the second light-emitting region. The light-transmitting region is located between the first light-emitting region and the second light-emitting region. The light-transmitting region is not located in a region between light-emitting regions adjacent to each other in the first group and in a region between light-emitting regions adjacent to each other in the second group.

3 Claims, 5 Drawing Sheets

(51) Int. Cl.
- *H01L 27/12* (2006.01)
- *B31B 70/14* (2017.01)
- *B31B 50/02* (2017.01)
- *B31B 70/81* (2017.01)
- *B31B 70/16* (2017.01)
- *B31D 1/02* (2006.01)
- *B65D 33/34* (2006.01)
- *B65D 75/58* (2006.01)
- *B65D 77/32* (2006.01)
- *H01L 51/52* (2006.01)
- *B31B 170/20* (2017.01)
- *B31B 160/10* (2017.01)

(52) U.S. Cl.
CPC ......... *B65D 75/5838* (2013.01); *B65D 77/32* (2013.01); *H01L 27/124* (2013.01); *H01L 27/326* (2013.01); *H01L 27/3213* (2013.01); *H01L 27/3218* (2013.01); *H01L 27/3262* (2013.01); *H01L 27/3276* (2013.01); *B31B 2160/10* (2017.08); *B31B 2170/20* (2017.08); *B65D 2401/00* (2020.05); *B65D 2575/586* (2013.01); *H01L 27/322* (2013.01); *H01L 51/5284* (2013.01)

(56) References Cited

U.S. PATENT DOCUMENTS

2012/0286300 A1 11/2012 Kijima
2014/0111557 A1 4/2014 Omata et al.

\* cited by examiner

DISPLAY DEVICE

CROSS-REFERENCE TO RELATED APPLICATION

The present application is a continuation of U.S. application Ser. No. 15/473,856, filed Mar. 30, 2017, which claims priority from Japanese application JP2016-135143 filed on Jul. 7, 2016, the contents of which are hereby incorporated by reference into this application.

BACKGROUND OF THE INVENTION

1. Field of the Invention

The present invention relates to a display device.

2. Description of the Related Art

There has been known a so-called transparent display device that displays an image on a display area and has a structure allowing the object beyond the display device to be seen through. JP2012-238544A discloses a transparent display device in which adjacent three sub-pixels, including a red sub-pixel, a green sub-pixel, and a blue sub-pixel constitute one pixel, and the transparent display device has a transparent region (light-transmitting region) adjacent to the pixel (refer to FIG. 14(b) of JP2012-238544A). Further, JP2014-085384A discloses a pixel circuit and a driving method thereof in which a plurality of adjacent sub-pixels in a column direction share an output switch and a threshold voltage and variations in mobility of a drive transistor of each sub-pixel are cancelled.

In recent years, transparency of transparent display devices is expected to be enhanced. In order to enhance transparency, it can be considered to increase a ratio of a light-transmitting region in a display area. Such a case, however, has the drawback that the number of pixels is decreased and definition of images is declined.

SUMMARY OF THE INVENTION

One or more embodiments of the present invention have been conceived in view of the above, and an object thereof is to enhance transparency and definition of a display device having a light-transmitting region.

A display device according to one aspect of the present invention includes a plurality of pixels each having a plurality of light-emitting regions including at least a first light-emitting region of a first color, a second light-emitting region of a second color, and a third light-emitting region of a third color and a light-transmitting region, wherein visibility of the first color is higher than visibility of the second color, the visibility of the second color is higher than visibility of the third color, the plurality of light-emitting regions are divided into a first group including the first light-emitting region and a second group including the second light-emitting region, the first light-emitting region is adjacent to the second light-emitting region, the light-transmitting region is located between the first light-emitting region and the second light-emitting region, and the light-transmitting region is not located in a region between light-emitting regions adjacent to each other in the first group and in a region between light-emitting regions adjacent to each other in the second group.

A display device according to another aspect of the present invention includes a first pixel that includes a red sub-pixel, a green first sub-pixel, a green second sub-pixel, and a blue sub-pixel, a second pixel that is adjacent to the first pixel in a first direction and includes a red sub-pixel, a green first sub-pixel, a green second sub-pixel, and a blue sub-pixel, and a light-transmitting region through which light transmits, wherein the first pixel includes a first sub-pixel group that includes the blue sub-pixel and the green first sub-pixel adjacent to each other in the first direction, and a second sub-pixel group that includes the green second sub-pixel and the red sub-pixel adjacent to each other in the first direction and is adjacent to the first sub-pixel group in a second direction intersecting the first direction, the second pixel includes a third sub-pixel group that includes the green first sub-pixel and the red sub-pixel adjacent to each other in the first direction, and a fourth sub-pixel group that includes the blue sub-pixel and the green second sub-pixel adjacent to each other in the first direction and is adjacent to the third sub-pixel group in the second direction, wherein the first sub-pixel group and the third sub-pixel group are arranged in the first direction, the second sub-pixel group and the fourth sub-pixel group are arranged in the first direction, the light-transmitting region includes a first region that includes a region between the first sub-pixel group and the second sub-pixel group and a region between the third sub-pixel group and the fourth sub-pixel group and extends in the first direction, a second region that includes a region between the first sub-pixel group and the third sub-pixel group and a region between the second sub-pixel group and the fourth sub-pixel group and extends in the second direction.

A display device according to another aspect of the present invention includes a first pixel that includes a red sub-pixel, a green sub-pixel, a white sub-pixel, and a blue sub-pixel, a second pixel that is adjacent to the first pixel in a first direction and includes a red sub-pixel, a green sub-pixel, a white sub-pixel, and a blue sub-pixel, and a light-transmitting region through which light transmits, wherein the first pixel includes a first sub-pixel group that includes the white sub-pixel and the blue sub-pixel adjacent to each other in the first direction; and a second sub-pixel group that includes the green second sub-pixel and the red sub-pixel adjacent to each other in the first direction and is adjacent to the first sub-pixel group in a second direction intersecting the first direction, the second pixel includes a third sub-pixel group that includes the green sub-pixel and the red sub-pixel adjacent to each other in the first direction, and a fourth sub-pixel group that includes the white sub-pixel and the blue sub-pixel adjacent to each other in the first direction and is adjacent to the third sub-pixel group in the second direction, wherein the first sub-pixel group and the third sub-pixel group are aligned in the first direction, the second sub-pixel group and the fourth sub-pixel group are aligned in the first direction, the light-transmitting region includes a first region that includes a region between the first sub-pixel group and the second sub-pixel group and a region between the third sub-pixel group and the fourth sub-pixel group and extends in the first direction, a second region that includes a region between the first sub-pixel group and the third sub-pixel group and a region between the second sub-pixel group and the fourth sub-pixel group and extends in the second direction.

DETAILED DESCRIPTION OF THE INVENTION

Embodiments of the present invention (hereinafter, referred to as the present embodiments) are described below with reference to the accompanying drawings. The disclosure herein is merely an example, and appropriate modifications coming within the spirit of the present invention, which are easily conceived by those skilled in the art, are intended to be included within the scope of the invention as a matter of course. In the accompanying drawings, widths, thicknesses, shapes, or other characteristics of each part are schematically illustrated compared to actual configurations for clarity of illustration. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the present embodiments, when a positional relationship between a component and another component is defined, the words "on" and "below" suggest not only a case where the another component is disposed immediately on or below the component, but also a case where the component is disposed on or below the another component with a third component interposed therebetween.

Figure 1:
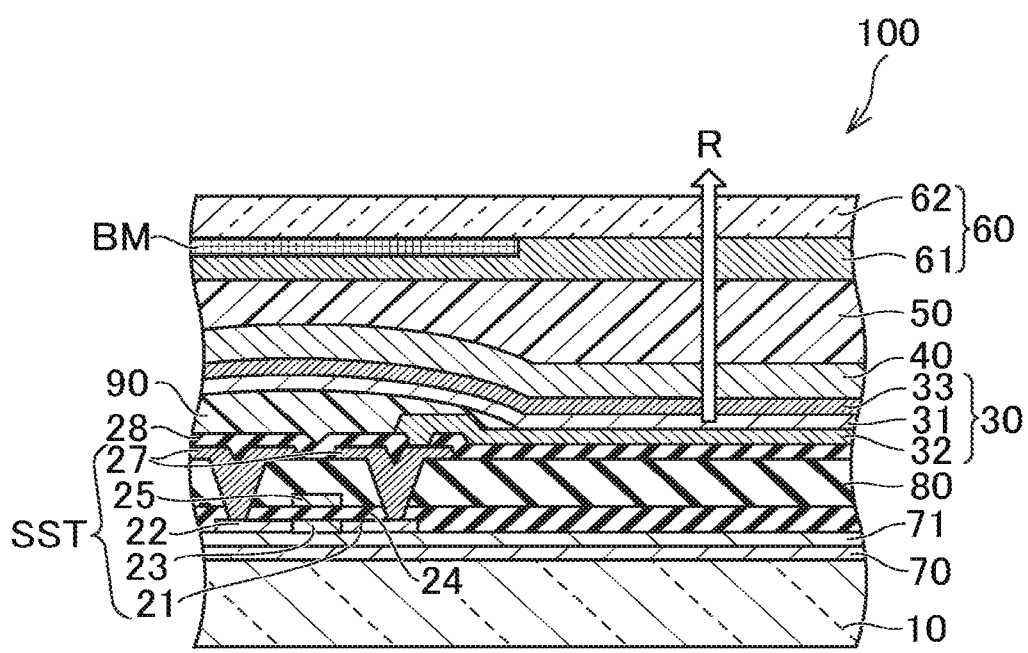
FIG. 1 is a schematic sectional view schematically illustrating a cross-sectional view of the display device around a pixel switch transistor according to the present embodiments.

FIG. 1 is a schematic sectional view schematically illustrating a cross-sectional view of the display device around a pixel switch transistor according to the present embodiments. A display device 100 is a so-called transparent display device that displays an image on a display area A (see FIG. 2), while allowing an object beyond the display area A to be seen through. The display device 100 is a so-called top-emitting display device that takes out light from an organic light-emitting diode 30 from a direction opposite to a substrate 10 (R-arrow direction in FIG. 1), and an active-driving type OLED (Organic Light Emitting Diode) display device.

As shown in FIG. 1, the display device 100 includes the substrate 10, a pixel switch transistor SST, the organic light-emitting diode 30, a seal 40, a filler 50, and a counter substrate 60, and has a structure in which these elements are laminated. In the present embodiments, the organic light-emitting diode 30 is used as a light emitting element, although a quantum dot light-emitting element may also be used as a light emitting element.

The pixel switch transistor SST includes source/drain regions 21 and 22, a polysilicon layer 23, a gate line layer 25, and source/drain electrodes 27. Further, a first insulating interlayer 24 is provided on the polysilicon layer 23, and a second insulating interlayer 28 is provided on the source/drain electrodes 27. A first base film 70 made of a material such as silicon nitride (SiNx) is disposed between the substrate 10 and the pixel switch transistor SST so that an ion, such as natrium and kalium, is not mixed into the polysilicon layer 23 and the gate line layer 25 from the substrate 10. A second base film 71 made of silicon oxide (SiOx) is disposed between the first base film 70 and the polysilicon layer 23. An insulating film 80 is provided on the second base film 71.

The organic light-emitting diode 30 includes an organic EL (Electro Luminescence) layer 31, a lower electrode 32 provided below the organic EL layer 31, and an upper electrode 33 provided on the organic EL layer 31. One of the lower electrode 32 and the upper electrode 33 functions as an anode, and the other functions as a cathode.

The organic EL layer 31 covers the lower electrode 32 in a region that is to be the light-emitting region L (see FIG. 4), and is connected to one of the source/drain electrodes 27 through a hole penetrating the second insulating interlayer 28. A third insulating interlayer (hereinafter referred to as a bank) 90 is formed in a non-light emitting region. The organic EL layer 31 is provided so as to cover the lower electrode 32, and separated from the lower electrode 32 in the non-light emitting region by the bank 90. The upper electrode 33 is provided so as to cover the entire organic EL layer 31.

Here, the configuration of the organic EL layer 31 will be discussed. The configuration of the organic EL layer 31 is well known technology, and thus, is simplified in FIG. 1. The organic EL layer 31 is configured by stacking an electron transport layer, a light emitting layer, and a hole transport layer, from the cathode side to the anode side in this order. A hole injection layer and a hole blocking layer may be disposed between the anode and the light emitting layer in addition to the hole transport layer. Further, an electron injection layer or an electron blocking layer may be disposed between the cathode and the light emitting layer in addition to the electron transport layer. The light emitting layer and the electron transport layer may be one layer made of materials capable of serving their functions.

When a DC voltage is applied between the lower electrode 32 and the upper electrode 33, holes injected from the anode side reach the light emitting layer through the hole transport layer, while electrons injected from the cathode side reach the light emitting layer through the electron transport layer, and thus the electrons and the holes are recombined. With the recombination of the electrons and the holes, the organic light-emitting diode 30 emits light having a predetermined wavelength. In order to efficiently utilize light emitted from the light emitting layer, the lower electrode 32 is preferably made of a material having a high light reflectance. The lower electrode 32 may be configured by laminating a transparent conductive film made of a material such as indium tin oxide (ITO) and a reflective film made of a material such as silver.

The seal 40 is formed so as to cover the upper electrode 33. The seal 40 preferably has high gas barrier property so as to protect the organic light-emitting diode 30 from water, for example, and is transparent to visible light. For example, a dense inorganic layer, such as silicon oxide, or a laminated film of an inorganic layer and an organic layer may be used as the seal 40. The counter substrate 60 is formed on the seal 40 through the transparent filler 50 made of a polymeric material.

The counter substrate 60 includes a color filter 61, a black matrix BM disposed around the color filter 61, and a transparent substrate 62 disposed on the color filter 61. Although a glass substrate is used as the substrate 10, it is not limited thereto and any substrate having insulation properties, such as a resin substrate, may be used.

Figure 2:
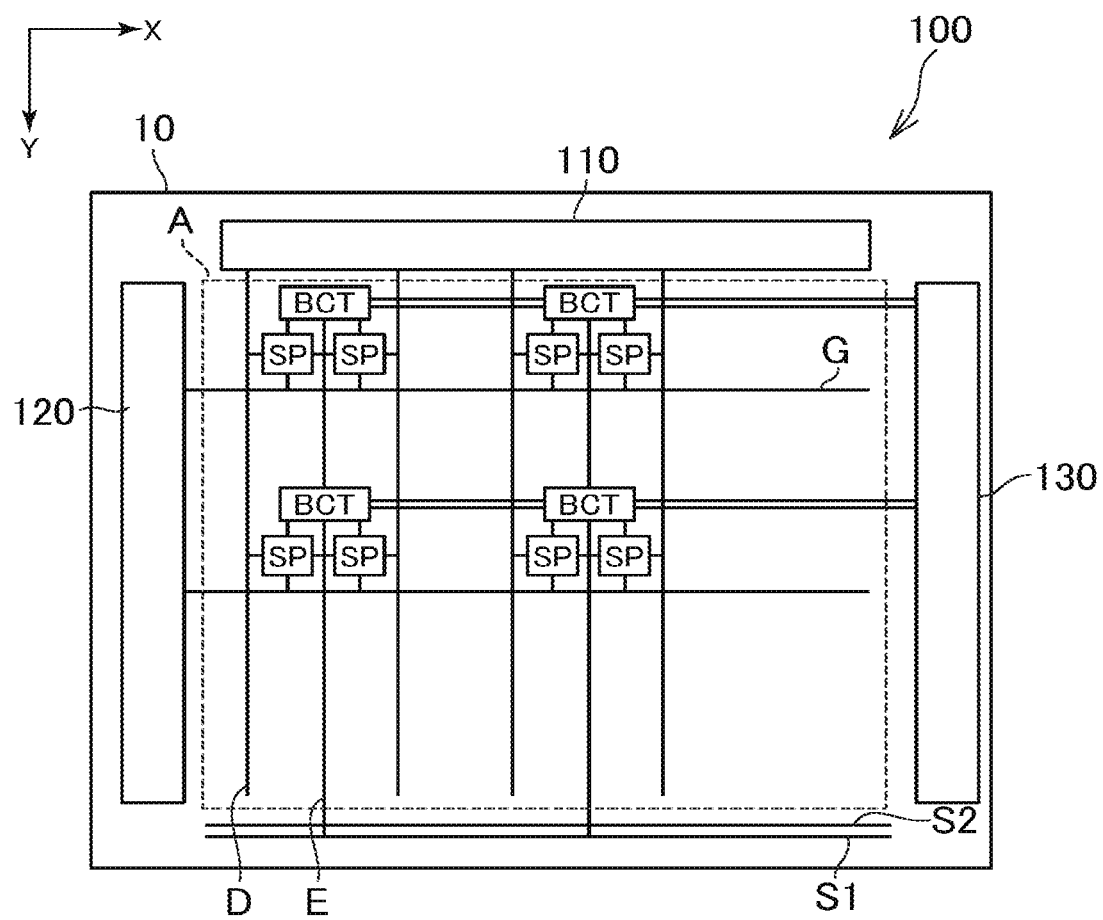
FIG. 2 is a schematic view illustrating a wiring structure of the display device according to the present embodiments.
Figure 3:
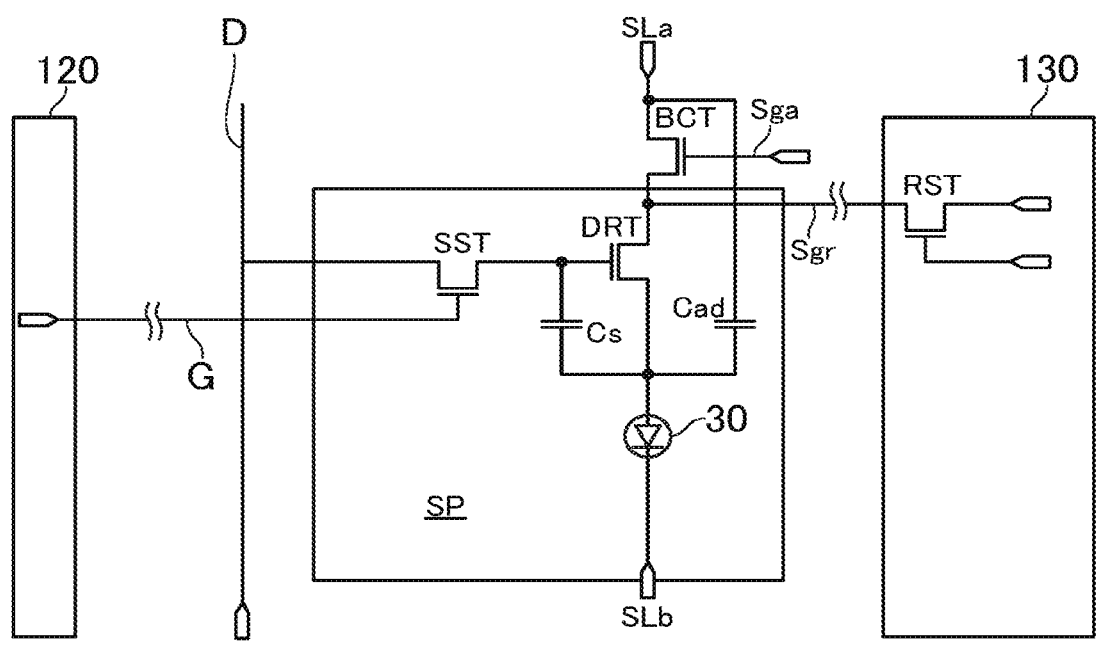
FIG. 3 is a diagram of an equivalent circuit per sub-pixel of an active matrix constituting the display device according to the present embodiments.

Next, referring to FIGS. 2 and 3, an outline of a circuit configuration of the display device according to the present embodiments will be discussed. FIG. 2 is a schematic view illustrating a wiring structure of the display device according to the present embodiments. FIG. 3 is a diagram illustrating an equivalent circuit per sub-pixel of an active matrix constituting the display device according to the present embodiments.

In FIG. 2, a region surrounded by dashed lines on the substrate 10 indicates a display area A, which displays an image. On the display area A, a plurality of sub-pixels SP are disposed in a matrix. As shown in FIG. 2, a data driving circuit 110 that outputs an image signal to a data line D, a scan driving circuit 120 that outputs a scanning signal to a gate line G, and an output driving circuit 130 that drives an output switch transistor BCT are disposed around the display area A. The output driving circuit 130 includes a reset switch transistor RST (see FIG. 3) that is used common to the sub-pixels SP arranged in X-direction in FIG. 2. As described in details later, as shown in FIG. 2, the output switch transistor BCT is provided so as to be used common to two sub-pixels SP adjacent to each other in the X-direction.

As shown in FIG. 3, each sub-pixel SP includes a pixel switch transistor SST, an organic light-emitting diode 30, a storage capacitor Cs, a pixel capacitor Cad, and a driver transistor DRT. The storage capacitor Cs and the pixel capacitor Cad are condensers. The pixel capacitor Cad is an element for controlling a light emission current amount, and is not needed in some cases. In the pixel switch transistor SST, the gate electrode is connected to the gate line G, one of the source/drain electrodes is connected to the data line D, and the other one of the source/drain electrodes is connected to the storage capacitor Cs. In the driver transistor DRT, the gate electrode is connected to the storage capacitor Cs, the source electrode is connected to a potential wiring E (see FIG. 2) through the output switch transistor BCT, and the drain electrode is connected to one of electrodes of the organic light-emitting diode 30. Further, the other one of the electrodes of the organic light-emitting diode 30 is connected to current supply lines S1 and S2 (see FIG. 2), which are used common to all sub-pixels SP, and is held at a predetermined potential. The pixel switch transistor SST, the driver transistor DRT, the output switch transistor BCT, and the reset switch transistor RST are formed by the same conductivity type thin-film transistors, such as n-channel type thin-film transistors.

In the pixel circuit of the sub-pixel SP shown in FIG. 3, the driver transistor DRT and the output switch transistor BCT are connected to the organic light-emitting diode 30 in series between a high-potential power supply line SLa and a low-potential power supply line SLb, and the gate electrode is connected to a scanning line Sga. The driver transistor DRT includes a source electrode connected to the organic light-emitting diode 30, a drain electrode connected to a reset wiring Sgr, and a gate electrode. The output switch transistor BCT switches drain electrodes of the high-potential power supply line SLa and the driver transistor DRT to a conducting state or a non-conducting state.

The pixel switch transistor SST is connected the data line D and the gate electrodes of the driver transistor DRT, and switches whether to capture a video signal Vsig, which is transmitted through the data line D, into the gate electrode of the driver transistor DRT. The captured signal is stored in the storage capacitor Cs.

The two adjacent sub-pixels SP in the X-direction share the output switch transistor BCT (see FIG. 2). This enables to reduce to half of the number of the output switch transistor BCT and reduce light-shielded area, compared to a case where each sub-pixel SP is provided with an output switch transistor BCT, and thus it is possible to provide a display device having higher transparency.

When a display is performed with a known driving method in the sub-pixel circuit configuration described above, an output current given to the organic light-emitting diode has a value that does not depend on a threshold voltage of the driver transistor DRT. Further, the effect of the mobility of the driver transistor DRT can be compensated. As such, display defect caused by characteristic variance in the driver transistor DRT, streak-like irregularities, and roughness are prevented, and high-quality image display is enabled with three or less number of transistors per sub-pixel. In this case, the smaller number of transistors can reduce an area shielded from light by the transistors and the surrounding wiring, and thus it is possible to provide a display device having higher transparency.

Figure 4:
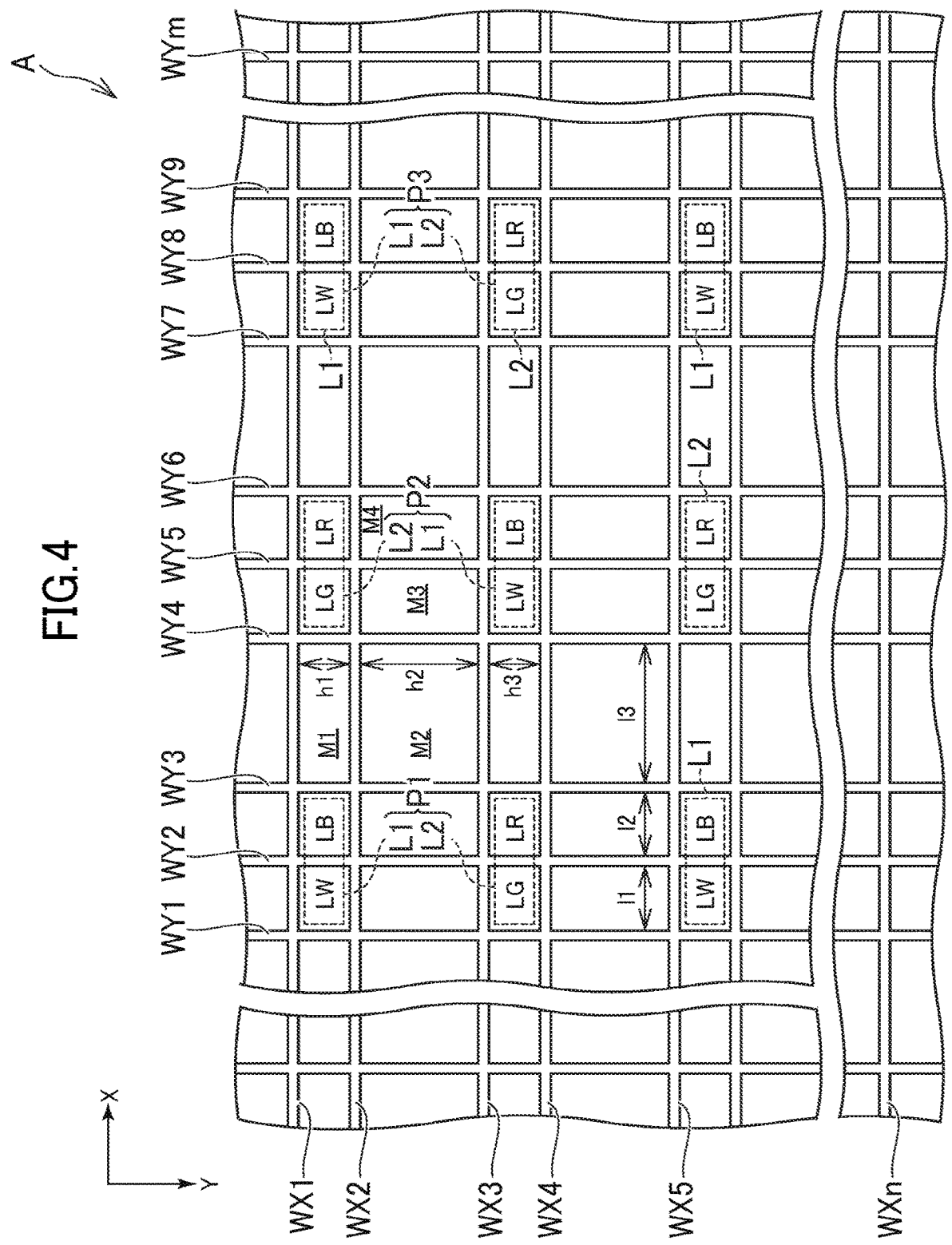
FIG. 4 is a schematic view of a light-emitting region and a light-transmitting region in the display device according to the present embodiments.

FIG. 4 is a schematic view of the light-emitting region and the light-transmitting region in the display device according to the present embodiments. The display device 100 includes a plurality of pixels P arranged in a matrix on the display area A and a light-transmitting region M. In a case where light-emitting regions need to be distinguished, a light-emitting region is described with, for example, a number (1, 2) indicating a group number or an alphabet letter (W, B, G, R) indicating a color in addition to "L" indicating a light-emitting region. In a case where light-emitting regions do not need to be distinguished, a light-emitting region is simply described as a light-emitting region L. The same applies to pixels P, light-transmitting regions M, and wirings W.

A pixel P is formed of a plurality of light-emitting regions L having at least three luminescent colors. In the present embodiments, as shown in FIG. 4, a pixel P is formed of four-color light-emitting regions divided into a light-emitting region LW with white luminescent color, a light-emitting region LB with blue luminescent color, a light-emitting region LG with green luminescent color, and a light-emitting region LR with red luminescent color. The light-emitting regions LW, LB, LG, and LR are regions in which sub-pixels SP respectively disposed in corresponding light-emitting regions are controlled in brightness and emit light.

The present embodiments employ a color filter method in which all light-emitting regions L emit the same color (e.g., white), and only light having a predetermined wavelength transmits each light-emitting region L through a color filter 61 provided in a counter substrate 60, but not limited to this. The present embodiments may employ a color-separation method for splitting the organic EL layer 31 to emit light of colors according to luminescent colors of the respective light-emitting regions L.

The light-emitting region L is a region divided by wirings W, and has sub-pixels SP arranged therein. The light-transmitting region M is an opening region divided by wirings W, and allows an object beyond the display area device A to be seen through. The wirings shown in FIG. 4 are, for example, the gate line G and the data line D described by referring to FIGS. 2 and 3, although any type of wiring may be used. As such, a wiring extending in the X-direction (first direction) is described as a wiring WX, and a wiring extending in the Y-direction (second direction) perpendicular to the X-direction is described as a wiring WY. As shown in FIG. 4, n wirings WX (n is an integer) are arranged in the Y-direction, and m wirings WY (m is an integer) are arranged in the X-direction.

In each pixel P, light-emitting regions L are divided into light-emitting regions of a first group L1 and light-emitting regions of a second group L2. In the present embodiments, light-emitting regions LW and light-emitting regions LB are light-emitting regions of a first group L1, and light-emitting regions LG and light-emitting regions LR are light-emitting regions of a second group L2.

In the present embodiments, the top two light-emitting regions L in the visibility of luminescent colors are respectively included in the first group L1 and the second group L2. In the light-emitting regions LW, LB, LG, and LR, respectively in white, blue, green, and red colors, the luminescent colors of the top two light-emitting regions in the visibility are white and green. As such, the light-emitting region LW having a white luminescent color belongs to the first group L1, and the light-emitting region LG having a green luminescent color belongs to the second group L2. In this regard, the visibility indicates a degree to which a person feels brightness, and light having about 550 nm wavelength is known to have high visibility.

On the other hand, in the light-emitting regions LW, LB, LG, and LR, respectively in white, blue, green, and red colors, the luminescent colors of the lowest two light-emitting regions in the visibility are blue and red. These two lowest light-emitting regions LB and LR in the visibility are respectively combined with the top two light-emitting regions LW and LG in the visibility, and this enables to provide enough visibility in both of the first group L1 and the second group L2. Specifically, the blue light-emitting region LB is provided in the first group L1 so as to be adjacent to the white light-emitting region LW in the X-direction, and the red light-emitting region LR is provided in the second group L2 so as to be adjacent to the green light-emitting region LG in the X-direction.

Further, the display device 100 includes at least a light-transmitting region M formed in a region between the light-emitting regions LW and LB in the first group L1 and the light-emitting regions LG and LR in the second group L2. In the present embodiments, the light-transmitting region M is formed so as to surround the light-emitting regions LW and LB in the first group L1 and the light-emitting regions LG and LR in the second group L2. That is, in FIG. 4, a region other than the light-emitting region L and the wiring W is the light-transmitting region M. In another viewpoint, it can be said that the L-shaped light-transmitting region M is disposed around the light-emitting regions L forming one group. For example, as shown in FIG. 4, it can be said that the L-shaped light-transmitting region M, which includes the light-transmitting region M1 adjacent to the light-emitting region LG in the X-direction, the light-transmitting region M2 adjacent to the light-transmitting region M1 in the Y-direction, the light-transmitting region M3 adjacent to the light-transmitting region M2 in the X-direction, and the light-transmitting region M4 adjacent to the light-transmitting region M3 in the X-direction, is disposed around the light-emitting regions LG and LR of the second group L2 of the pixel P2. This structure enables to increase a ratio of a light-transmitting region M in one pixel P, and thus improvement in transparency can be expected.

In the present embodiments, a light-emitting region LW and a light-emitting region LB are arranged in the X-direction in any pixel P (e.g., P1, P2, P3) in the light-emitting regions in the first group L1. Similarly, a light-emitting region LG and a light-emitting region LR are arranged in the X-direction in any pixel P in the light-emitting regions in the second group L2. In this way, the light-emitting regions L adjacent to each other in the same group have luminescent colors different from each other. Further, in the pixels P (P1, P2) adjacent to each other in the X-direction, the light-emitting regions LW and LB in the first group L1 and the light-emitting regions LG and LR in the second group L2 are placed so as to oppose to each other in the Y-direction. That is, the light-emitting regions LW and LB in the first group L1 of the pixel P1 are arranged in the X-direction to be adjacent to the light-emitting regions LG and LR in the second group L2 of the pixel P2, and the light-emitting regions LG and LR in the second group L2 of the pixel P1 are arranged in the X-direction to be adjacent to the light-emitting regions LW and LB in the first group L1 of the pixel P2. The adjacent light-emitting regions L respectively included in the adjacent pixels P are constructed to have luminescent colors different from each other. In other words, the light-emitting region LB of the pixel P1 is arranged in the X-direction to be adjacent to the light-emitting region LG of the pixel P2, and the light-emitting region LR of pixel P1 is arranged in the X-direction to be adjacent to the light-emitting region LW of the pixel P2.

As described above, in the present embodiments, light-transmitting regions M are disposed between the light-emitting regions LW and LB in the first group L1 and the light-emitting regions LG and LR in the second group L2, which form one pixel P. This structure enables to increase a ratio of light-transmitting regions M in the display area A, and thus improvement in transparency can be expected. Further, white, blue, green, and red light-emitting regions LW, LB, LG, and LR forming one pixel P are divided into two groups for placement, and thus improvement in definition of an image can be expected. In addition, a white light-emitting region LW having high visibility is placed in the first group L1, and a green light-emitting region LG having low visibility is placed in the second group L2, and thus enough visibility can be obtained in both of the groups. In other words, enough visibility can be obtained throughout the display area A. When an image is displayed, known sub-pixel rendering is performed based on an image signal so that each of a white sub-pixel having high visibility and a green sub-pixel having high visibility corresponds to one pixel, and thus it is possible to enhance effective definition of the image perceived by the human eye. As such, the transparent display device having high definition of the image and high transparency can be provided.

In the present embodiments, the light-transmitting regions M are formed so as to surround the light-emitting regions LW and LB in the first group L1 and the light-emitting regions LG and LR in the second group L2, but not limited to this. The light-transmitting regions M may be formed so as to at least avoid a region between the light-emitting region LW and the light-emitting region LB, which are adjacent to each other in the first group L1, a region between the light-emitting region LG and the light-emitting region LR, which are adjacent to each other in the second group L2, and a region between the light-emitting regions LW and LB in the first group L1 and the light-emitting regions LG and LR in the second group L2.

Here, in the light-transmitting regions M, there is a case where diffraction of light is caused by influence of edges of the wirings WX and WY. In particular, when regions are divided by the wirings WX and WY at regular intervals, that is, when the wirings WX and WY are arranged with a constant period (integral multiple), strong diffraction of light occurs. When the strong diffraction of light occurs, the light is scattered and the visibility is reduced. In the present embodiments, the light-transmitting regions M are divided in multiple regions of different widths so that different periods are mixedly used.

Specifically, when the width between the wiring WY1 and the wiring WY2 is l1, the width between the wiring WY2 and the wiring WY3 is l2, and the width between the wiring WY3 and the wiring WY4 is l3, l1=l2<l3. In this way, it is possible to prevent the diffraction of light from being strong and the visibility from being reduced by differentiating the width of l3 from the width of l1 and the width of l2. This is not limited thereto. For example, it is possible to further prevent the diffraction of light from being strong by differentiating the width of l1 from the width of l2. In the present embodiments, the width of l3 is greater than twice the width of l1 and the width of l2, and less than three times the width of l1 and the width of l2 so that the width of l3 is not an integral multiple of the width of l1 and the width of l2.

Similarly, when the width between the wiring WX1 and the wiring WX2 is h1, the width between the wiring WX2 and the wiring WX3 is h2, and the width between the wiring WX3 and the wiring WX4 is h3, h1=h3<h2. In this way, it is possible to prevent the diffraction of light from being strong by differentiating the width of h2 from the width of h1 and the width of h3. This is not limited thereto. For example, it is possible to further prevent the diffraction of light from being strong by differentiating the width of h1 from the width of h3. In the present embodiments, the width of h2 is greater than twice the width of h1 and the width of h3, and less than three times the width of h1 and the width of h3 so that the width of h2 is not an integral multiple of the width of h1 and the width of h3.

The light-transmitting region M needs to allow an object beyond the display area A to be seen through, while a transistor provided on each sub-pixel SP needs to avoid projecting from the light-emitting region L and being provided on the light-transmitting region M. In particular, in the present embodiments, the light-emitting regions L forming one pixel P are divided into two groups, and thus a size of light-emitting regions L collectively disposed is reduced. As such, some consideration is needed regarding the arrangement of the transistors so that the transistors do not project from the light-emitting regions L.

In the present embodiments, as shown in FIG. 3, an output switch transistor BCT is used common to two light-emitting regions L (sub-pixels SP). In other words, the output switch transistor BCT (first transistor), which is used common to the light-emitting region LW and the light-emitting region LB in the first group L1, is provided. Similarly, an output switch transistor BCT (second transistor), which is used common to the light-emitting region LG and the light-emitting region LR in the second group L2, is provided. Such structures enable to reduce the number of transistors in one light-emitting region L, thereby placing the transistors within the light-emitting region L and ensuring the transparency of the light-transmitting region M. In the present embodiments, the case is explained in which the output switch transistor BCT is used common to two light-emitting regions L, but is not limited to this. Further transparency is achieved by using a transistor used common to three or more light-emitting regions L.

Figure 5:
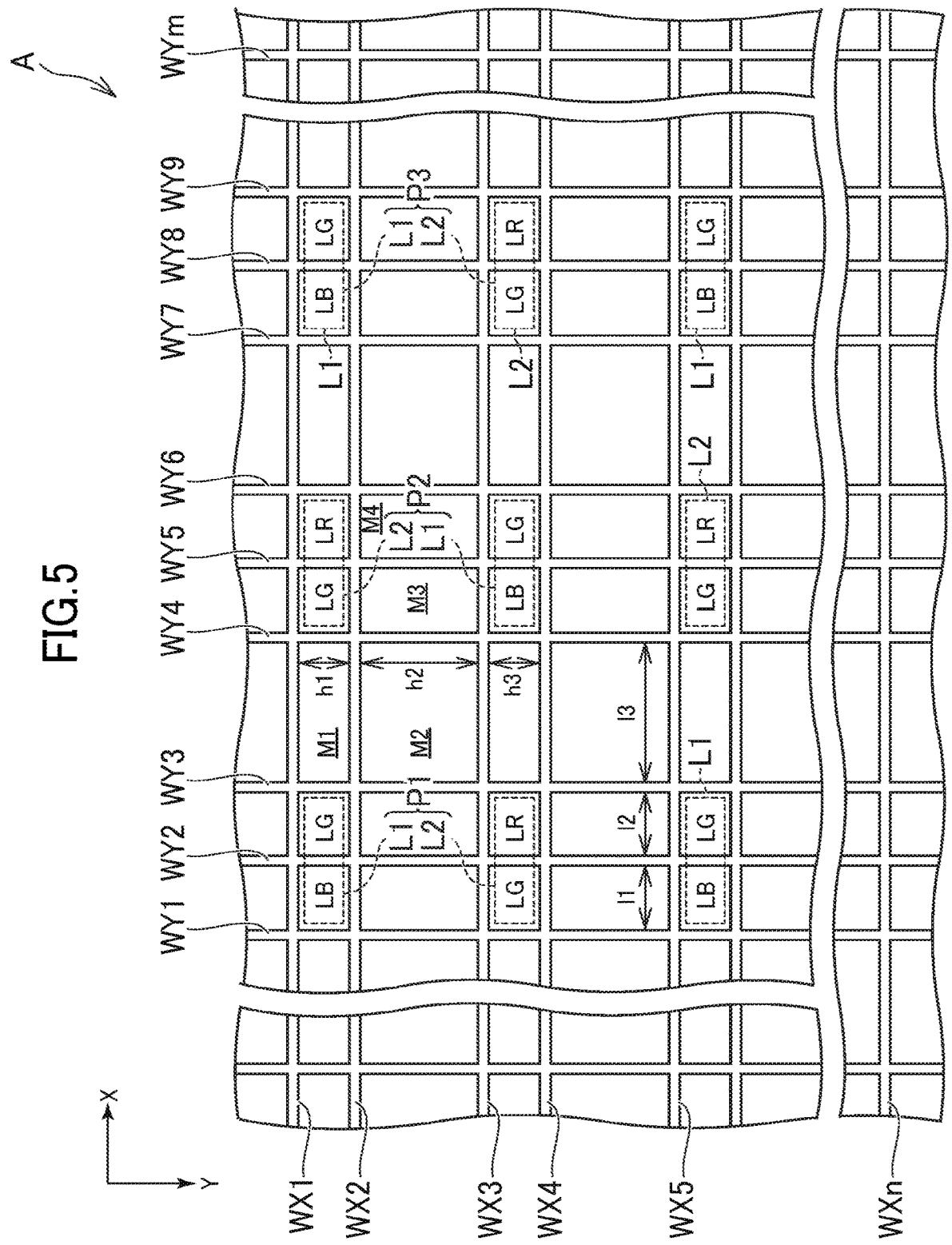
FIG. 5 is a schematic view of light-emitting regions and light-transmitting regions of the display device according to the modifications of the present embodiments.

Next, the display device according to modifications of the present embodiments (hereinafter simply referred to as modifications) will be discussed. FIG. 5 is a schematic view of light-emitting regions and light-transmitting regions of the display device according to the modifications. The display device according to the modifications is the same as the display device 100 described by referring to FIGS. 1 to 4 except the luminescent colors and arrangement of the light-emitting regions L. As such, explanation of the same elements will be omitted.

As shown in FIG. 5, in the modifications, a pixel P is formed of four light-emitting regions LB, LG, LG, and LR in three luminescent colors of blue, green, and red. In these four light-emitting regions, both of the top two light-emitting regions L in the visibility have luminescent colors of green. As such, the light-emitting regions in the first group L1 include the light-emitting region LB having a luminescent color of blue and the light-emitting region LG having a luminescent color of green, and the light-emitting regions in the second group L2 include the light-emitting region LG having a luminescent color of green and the light-emitting region LR having a luminescent color of red. In this way, a green light-emitting region LG having the high visibility is provided in each of the groups, thereby providing enough visibility.

In the modifications, similarly to the present embodiments described by referring to FIG. 4, a light-emitting region LB and a light-emitting region LG in a first group L1 are aligned in the X-direction in any pixel P (e.g., P1, P2, P3). Similarly, a light-emitting region LG and a light-emitting region LR in a second group L2 are aligned in the X-direction in any pixel P. In this way, light-emitting regions L adjacent to each other in the same group have different luminescent colors. Further, in the pixels P (P1, P2) adjacent to each other in the X-direction, the light-emitting regions LB and LG in the first group L1 and the light-emitting regions LG and LR in the second group L2 are placed so as to oppose to each other in the Y-direction. That is, the light-emitting regions LB and LG in the first group L1 of the pixel P1 are adjacent in the X-direction to the light-emitting regions LG and LR in the second group L2 of the pixel P2, and the light-emitting regions LG and LR in the second group L2 of the pixel P1 are adjacent in the X-direction to the light-emitting regions LB and LG in the first group of the pixel P2. The light-emitting regions L, which are adjacent to each other and included in respective pixels P adjacent to each other, have luminescent colors different from each other.

In the present embodiments, the arrangement order and luminescent colors of the light-emitting regions L are not limited to the examples shown in FIGS. 4 and 5, but may be constructed to have enough visibility in light-emitting regions in each group.

While there have been described what are at present considered to be certain embodiments of the invention, it will be understood that various modifications may be made thereto, and it is intended that the appended claim cover all such modifications as fall within the true spirit and scope of the invention.

What is claimed is:
1. A display device comprising:
a first pixel that includes a red sub-pixel, a green sub-pixel, a white sub-pixel, and a blue sub-pixel;
a second pixel that is adjacent to the first pixel in a first direction and includes a red sub-pixel, a green sub-pixel, a white sub-pixel, and a blue sub-pixel; and
a light-transmitting region through which light transmits, wherein
the first pixel comprises:
a first sub-pixel group that includes the white sub-pixel and the blue sub-pixel adjacent to each other in the first direction; and
a second sub-pixel group that includes the green second sub-pixel and the red sub-pixel adjacent to each other in the first direction and is adjacent to the first sub-pixel group in a second direction intersecting the first direction, the second pixel comprises:
  a third sub-pixel group that includes the green sub-pixel and the red sub-pixel adjacent to each other in the first direction; and
  a fourth sub-pixel group that includes the white sub-pixel and the blue sub-pixel adjacent to each other in the first direction and is adjacent to the third sub-pixel group in the second direction, wherein the first sub-pixel group and the third sub-pixel group are aligned in the first direction, the second sub-pixel group and the fourth sub-pixel group are aligned in the first direction, the light-transmitting region comprises:
  a first region that includes a region between the first sub-pixel group and the second sub-pixel group and a region between the third sub-pixel group and the fourth sub-pixel group and extends in the first direction,
  a second region that includes a region between the first sub-pixel group and the third sub-pixel group and a region between the second sub-pixel group and the fourth sub-pixel group and extends in the second direction.

2. The display device according to claim 1, wherein the blue sub-pixel of the first sub-pixel group opposes to the green sub-pixel of the third sub-pixel group, and the red sub-pixel of the second sub-pixel group opposes to the white sub-pixel of the fourth sub-pixel group.

3. The display device according to claim 1, wherein the first region intersects the second region between the first pixel and the second pixel.

* * * * *